United States Patent [19]

Bohn

[11] Patent Number: 5,046,105
[45] Date of Patent: Sep. 3, 1991

[54] AUDIO SIGNAL EQUALIZER HAVING ACCELERATED SLOPE PHASE SHIFT COMPENSATED FILTERS

[75] Inventor: Dennis A. Bohn, Everett, Wash.

[73] Assignee: Rane Corporation, Everett, Wash.

[21] Appl. No.: 516,608

[22] Filed: Apr. 30, 1990

[51] Int. Cl.⁵ .......................................... H03G 5/00
[52] U.S. Cl. .................................. 381/98; 333/28 T
[58] Field of Search ............. 333/28 T, 28 R; 381/61, 381/98, 101, 102

[56] References Cited

U.S. PATENT DOCUMENTS

| | | | |
|---|---|---|---|
| 4,176,329 | 11/1979 | Moskowitz | 381/101 |
| 4,262,260 | 4/1981 | Tamura | 333/28 T |
| 4,538,298 | 8/1985 | Bose | 333/28 T |
| 4,764,967 | 8/1988 | Christopher | 381/98 |
| 4,891,841 | 1/1990 | Bohn . | |

OTHER PUBLICATIONS

Audio Handbook by D. Bohn, National Semi Conductor, 1976, pp. 2-40 to 2-49.
Radiotron Designer's Handbook, Supplement, by F. Langford-Smith, Wireless Press, 1953, p. 1483.

Primary Examiner—Jin F. Ng
Assistant Examiner—Sylvia Chen
Attorney, Agent, or Firm—Larry A. Jackson

[57] ABSTRACT

A tone control shelving equalizer providing low shelf (bass) boost and cut, and high shelf (treble) boost and cut is disclosed wherein the active filter stages provide sharpened (accelerated) amplitude versus frequency response characteristics at the band transitions to leave the center frequencies uncorrupted by out-of-band effects of the tone controls while maintaining circuit stability and avoiding dropouts due to excessive filter phase shifts. Each high and low end band filter network has multiple poles and offset zeros located at a frequency offset so as to restrict the maximum phase shift of the filter to within a safe level not greater than about 90°.

19 Claims, 8 Drawing Sheets

FIG. 4a
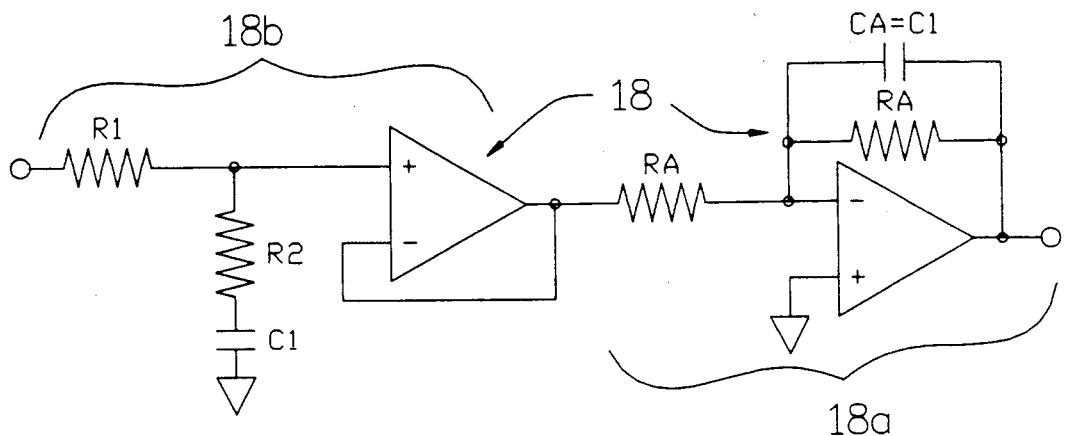
FIG. 4b
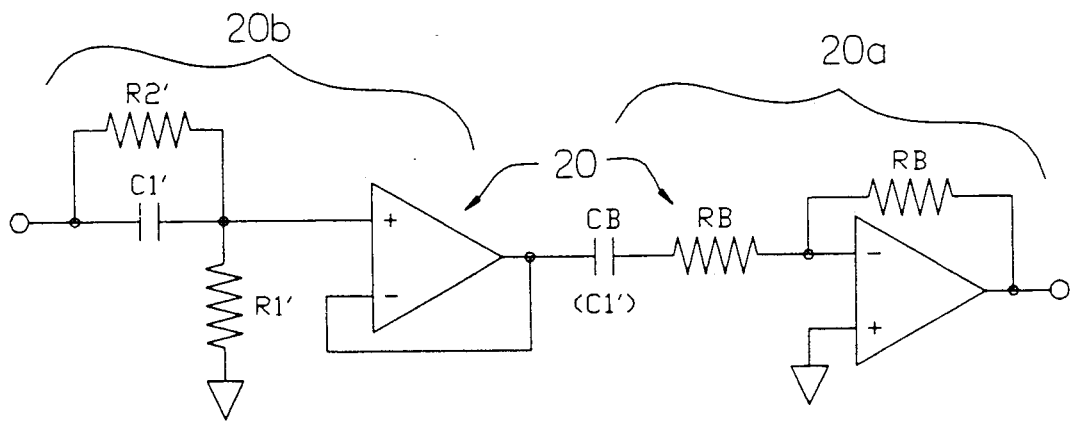
FIG. 4c
~ 1.8 × POLE (BASS); POLE ÷ 2.2 (TREBLE)
∴ BASS   POLE@150Hz   ZERO@270Hz $(1.8*f)$
∴ TREBLE   POLE@7.0kHz   ZERO@3.182kHz $\left(\dfrac{f}{2.2}\right)$ $$\frac{V_o}{V_i} = \frac{SR2C1+1}{(SRACA+1)(S(R1+R2)C1+1)}$$

REQUIRE RA=R1+R2

ZERO @ $\frac{1}{2\pi R2C1}$

POLES @ $\frac{1}{2\pi RACA}$

REQUIRE R1'‖R2'=RB   i.e., R1' = $\frac{RBR2'}{R2'-RB}$

ZERO @ $\frac{1}{2\pi R2'C1'}$

POLES @ $\frac{1}{2\pi RBCB}$

1. SELECT C=C1'=CB
2. PICK POLE: GIVES RB
3. CALCULATE ZERO $\frac{POLE}{2.2} = f_z$
4. ZERO GIVES R2'
5. CALCULATE R1'

AUDIO SIGNAL EQUALIZER HAVING ACCELERATED SLOPE PHASE SHIFT COMPENSATED FILTERS

BACKGROUND OF THE INVENTION

This invention pertains to audio signal equalizers including tone controls of the type that provide alterable amplitude versus frequency responses in selected bands of the audio spectrum. As an example, the equalizer may take the form of simple tone controls in which bass (low frequencies) and/or treble (high frequencies) are controllably boosted or cut to the listener's satisfaction.

Tone control equalizers, as the term is used here, refers to relatively uncomplex bass and treble tone controls found on most high-fidelity systems, and on certain professional audio recording counsels and mixers. The tone control circuitry that is typically found in such systems most commonly uses a negative feedback circuit of the type disclosed by P. J. Baxandall based on work done in 1952. Baxandall, P. J., "Negative Feedback Tone Control—Independent Variation of Bass and Treble Without Switches", W.W. 58.10 (October 1952) 402; Correction 58.11, (November 1952) 444. The Baxandall tone control circuit is commonly referred to as a "shelving" control because of the shape created by the amplitude versus frequency response when boosting or cutting the low and high end frequencies. The shape of the response curves when using such a "shelving" circuit is that of a shelf, contrasted with peak or dip-type response shapes, and further contrasted with total lifting or rolling off of the response. That is to say, the shelving tone controls cause amplification (boost) or attenuation (cut) at a substantially constant slope or rate and then level off to a flat response.

Almost universally, these shelving tone controls are provided by one-pole filter circuits. The steepest response slope that can ever be achieved by a one-pole filter is a 6 dB/octave (corresponds also to 20 dB/decade). This would be for an ideal filter circuit. In practice, the overall shelving tone control transfer function results in a response slope of the tone control that rarely exceeds about 3 dB/octave. This is a relatively gentle slope and causes the control to influence the mid-band frequencies because of overlapping effects that extend into the response characteristics of the mid-band from the adjacent high and low frequencies. Such corruption of the mid-band frequencies causes disturbing effects on the critical mid-band frequencies whenever bass or treble is altered by relative boosting or cutting.

Ideally, the boost and cut tone controls should change the slope of the transition frequencies into the high and low end but should not alter the response characteristics of the center or mid-band frequencies. Practical, existing filter designs have thusfar not effectively isolated the high and low band tone controls from the center or mid-band frequencies.

Although it is conceivable that filters having additional poles with sharper response characteristics could be incorporated into the tone control circuitry, such multiple pole filters create a different problem. That problem is the creation of excessive phase shift, approaching 180°, that produces cancellations and drop-outs due to frequencies that are out of phase with the input signal. Stability problems also appear because of the tendency of oscillations at or near the 180° phase shift regime. Rather than accept such problems of drop-outs, or cancellations and other instabilities, most tone control circuits use the single pole filter. Such single pole filters have a maximum phase shift of 90° and, therefore, are inherently stable and preclude cancellations since the frequency shift never approaches the 180° regime.

SUMMARY OF THE INVENTION

In accordance with the invention described more fully below and shown in the accompanying drawings, my solution to the foregoing problem of unwanted corruption of the mid-band frequencies due to variations in the tone controls, is to incorporate in the equalizer, filters that have two or three or more poles to achieve the desired steepness of the frequency response and then compensate for the otherwise excessive phase shift that would result by incorporating one or more zeros offset from the poles so as to lie outside the high or low band frequencies of interest, one such offset zero being provided for each additional pole that is added to the filter. This offset zero is to be distinguished from a zero occurring in the overall transfer function of the shelving type tone control that is caused by the interaction of the filter's pole with the broad band signal and which causes the response curve to flatten out as a shelf. The zero due to pole interaction appears away from the mid-band, and is directly within high (or low) band of interest.

Thus, in the preferrred embodiment of the invention, a two-pole shelving filter is employed with one additional offset zero being located away from the two poles and toward the mid-band. The two poles provide the desired steep rise or fall into the low (or high) end frequencies and yet as the frequency moves back into the mid-band, the otherwise excessive phase shift that would occur with such a two-pole circuit is neatly cancelled out by the offset zero, restricting the phase shift back to a maximum of approximately 90° or less. The offset zero is preferably located toward the mid-band, and the influence the zero has on the amplitude of the signal in the low and high adjacent bands is inconsequential because of the effects of the remaining uncancelled pole.

In an alternative embodiment, three poles are used in the shelving filters and two offset zeros are provided to cancel the phase change contributions due to the second and third pole essentially in the same manner as described above for a two-pole, one-offset zero filter.

Thus, in a general sense, the present invention provides a tone control equalizer having a low and/or high end controllable gain filter stage with n poles and n−1 offset zeros where n is any integer value of 2 or more. While the principles of the invention may be adopted in a variety of controllable equalizer circuits, a preferred application of the invention is in a relatively simple bass and treble tone control equalizer configured in a shelving-type filter using active filter components.

These and other objects, advantages and features of the invention will be better understood after reading the following detailed description in conjunction with the appended drawings.

BRIEF DESCRIPTION OF THE DRAWINGS

FIGS. 4a, 4b and 4c are schematic diagrams of the bass and treble active inverting filter stages removed from the shelving circuitry of the equalizer of FIG. 1, and showing in FIG. 4c the formulas relating the RC component values to the preferred poles and zero locations.

DETAILED DESCRIPTION OF THE PREFERRED EMBODIMENT

Figure 1:
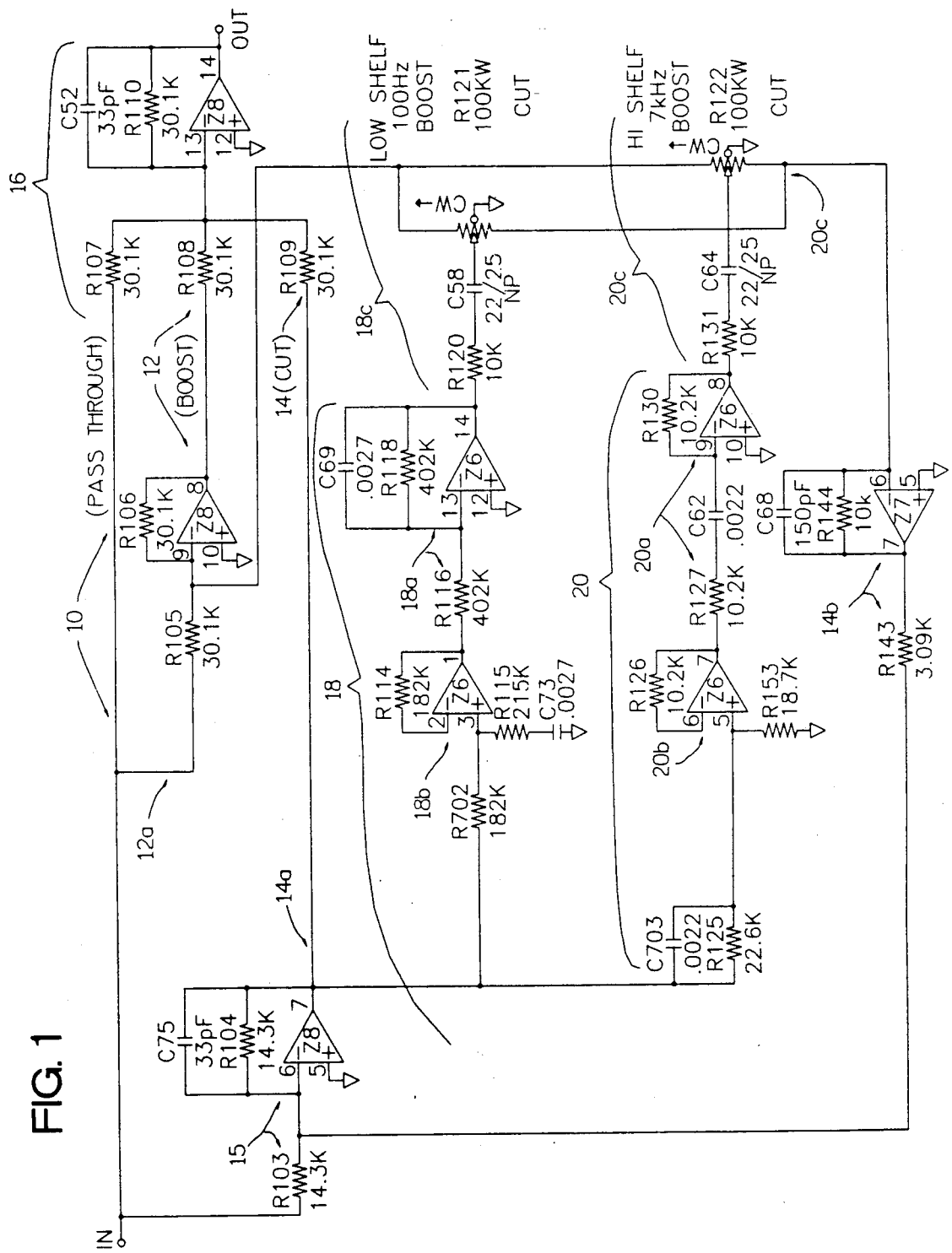
FIG. 1 is a schematic diagram of a preferred embodiment of the tone control equalizer using the phase compensating offset zero in a two-pole, one-zero equalizer filter circuit.

With reference to FIG. 1, a preferred embodiment of the tone control equalizer in accordance with the present invention is shown in a shelving filter configuration known as a reciprocal, subtractive equalizer as disclosed in my U.S. Pat. No. 4,891,841, issued Jan. 2, 1990. The reciprocal, subtractive audio spectrum equalizer incorporates a plurality of active filters within a multiple path equalizer configuration having between the signal input and output, a flat pass-through signal path 10, a boost signal path 12, and a cut signal path 14. Boost path 12 starts at the input, goes through a first inverting stage 15, then through the filter sections 18 and 20 with the gain controls 18c and 20c in the boost position to feed forward the boost signal components to amplifier Z8(9,8,10). Cut path 14 also starts at the input and through first inverting stage 15 and filter sections 18 and 20, but is then fed back with gain controls 18c and 20c in the cut position to inverting amplifier Z7(5,6,7) and R143, and again through input inverting amplifier stage 15 to contribute a negative cut signal component to combining circuit 16. The signal components from these three paths are subtractively combined in a combining circuit 16, all in a manner taught and known per se in my U.S. Pat. No. 4,891,841.

In accordance with the present invention and departing from the teaching of my prior patent, the active filter sections 18 and 20 for bass and treble, respectively, have two poles and one zero judiciously offset in frequency from the poles so as to achieve the phase compensation discussed above in the Summary of the Invention. More particularly, the bass filter section 18 is formed with a first pole stage 18a comprising operational amplifier Z6(12,13,14) and an associated RC pole network including C69, R118, and R116, and another stage 18b that provides both a second pole and an offset zero formed by the RC network of R702, R114, R115 and C702 associated with operational amplifer Z6(1,2,3). In cascade with filter stages 18a and 18b is a manually controllable potentiometer stage 18c that allows the output of the associated network 18 to vary from a zero or neutral center position, cw to contribute a boost of bass or low frequency components through the feed forward path 12, and in a ccw direction to cut the bass by directing the output of the filter section 18 through a feedback signal cut path 14. The net polarity change through bass filter section 18 is one of polarity inversion.

The relatively high end frequencies, or treble, are boosted or cut in the treble filter section 20 here formed by multiple active filter stages, including a stage 20a, provided by op. amplifier Z6(8,9,10) and RC components R130, C62, R127 forming a first pole, and a second stage 20b including Z6(5,6,7), resistors R126, R703, R125 and C703 providing a second pole and a compensating offset zero. Manual control is provided by potentiometer stage 20c in which a first, cw, direction of potentiometer movement boosts the high end frequencies through feed forward signal path 12 and the opposite ccw direction causes a cut of such frequencies through the feedback signal path 14.

Figure 2:
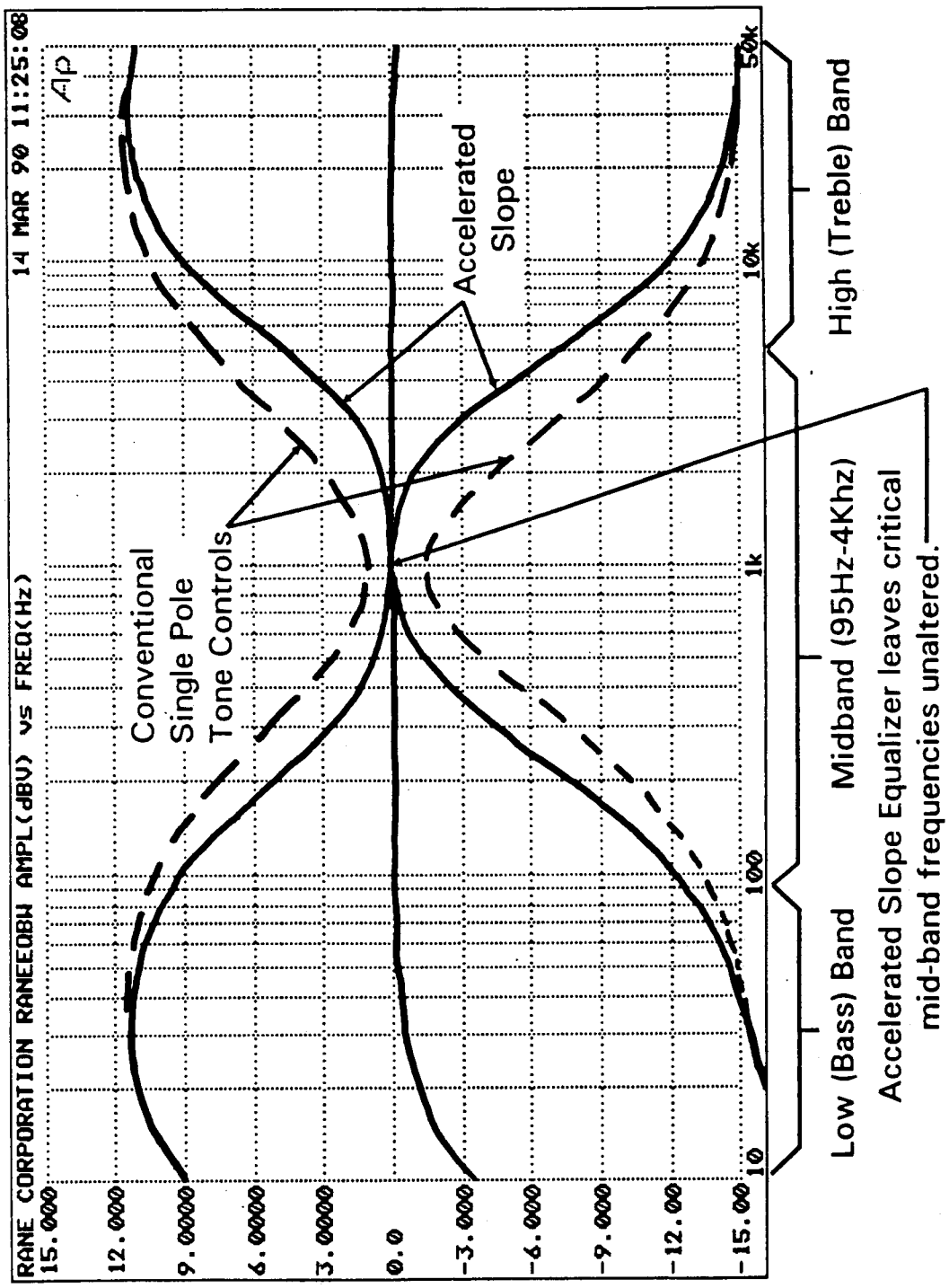
FIG. 2 is a plot of relative amplitude versus frequency showing, for comparison, the two-pole, one-zero phase compensated tone control equalizer of the FIG. 1 circuitry (solid lines) superimposed on a corresponding plot of the response characteristics of a conventional one-pole tone control filter.

By careful selection of the pole and zero locations of filter sections 18 and 20 in this type of shelving filter equalizer, sharper amplitude versus frequency curves are achieved in the transition regions between a mid-band as indicated in FIG. 2 and the adjacent high and low end bands (treble and bass, respectively). The manner of selecting the pole and zero locations is discussed below. When properly placed in accordance with the principles of the present invention, the filter response characteristics of sections 18 and 20 leave the center or mid-band frequencies, in this case centered at 1 kHz, substantially uncorrupted by the out-of-band effects of the frequency dependent characteristics of conventional one-pole filters that are shown for comparison by the dotted line curves in FIG. 2. In effect, by using the multiple pole filters with one or more offset compensating zeros, one compensating zero for each excess pole, the slope of the amplitude versus frequency response at the adjacent high and low bands is accentuated, or in other words, accelerated over what is normally achieved by the single pole active filters. Yet, by placing the zeros to cancel out the excess poles as the frequencies enter the mid-band regime, the center frequencies or mid-band of the audio equipment is left uncorrupted as shown by the solid line response characteristics of FIG. 2.

With regard to the placement of the additional pole and zero in a two-pole, one-zero accelerated slope circuit, some discussion is needed of the operation of the equalizer circuit. This type of equalizer circuit, known as a shelving equalizer, has the effect of adding back a frequency dependent signal to an input signal having a flat (frequency independent) signal in the case of boost, and adding back the reciprocal of the frequency dependent component in the case of cut. As mentioned above, a conventional one-pole filter within a shelving equalizer causes a pole induced zero (due to the characteristic signal combining effects of this type of equalizer) to occur at a frequency away from mid-band and located at the corner of the shelf. Such a pole induced zero is to be compared with and distinguished from the filter's offset compensating zero of the invention which is incorporated in the filter stage itself and has a frequency located toward the mid-band from the filter's pole and away from the high (or low) band of interest.

When the phase shift of the added back or cut back signal is 45° or less in phase shift from the main signal, then a straight forward addition and subtraction circuit works fine. The problem comes when the equalizer circuit starts introducing a phase shift or 90° or more. Between 90° and 180° or more, cancellation starts to take effect because the equalized signal has become shifted in phase so that it is opposite in amplitude change relative to the main signal. The cancellation area of concern is between 90° and 270° and is maximum with complete cancellation at 180°.

The configuration of a two-pole, one-zero offset equalizer network has the effect of adding an additional pole to sharpen the rise in the case of boosting, and the roll-off or cut-off in the case of cutting. The offset placement of the zero relative to the poles is to minimize or limit the amount of phase shifting that occurs in the equalizer, particularly as the corner frequency of the filter is approached. In other words, right around the 90° phase shift point, the zero kicks in and starts to minimize the amount of overall phase shifting that occurs to a maximum of 90° rather than a maximum of 180° as in the case of a two-pole circuit without an offset zero.

In designing the bass filter section 18, the compensating zero on a two-pole circuit is placed at an octave above the pole corner. More particularly, it is placed at substantially 1.8 times the corner frequency, hence toward the mid-band for bass to achieve in this particular tone control an empirically derived, optional phase compensation without substantial degradation of the two-pole response slope. The range of acceptable indexes or ratios is 1.75 to 2.75 times the corner frequency for bass boost and cut.

For the treble, the index or ratio is divided into the corner frequency. Thus in placing the compensating zero for the treble filter section 20 that has a corner frequency of 7.0 kHz, the 7.0 kHz is divided by the selected ratio within the range of 1.75 to 2.75. In the disclosed embodiment, using an index of 2.2 as the ratio, the zero would be placed at 7. 0kHz divided by 2.2, or 3.182 kHz. It is observed that the placement of the zero in the treble network is at a frequency less than the corner frequency and hence toward the mid-band as it is in this area where the phase shift starts to produce cancellation effects if a double pole without the zero compensation is used.

Figure 3A:
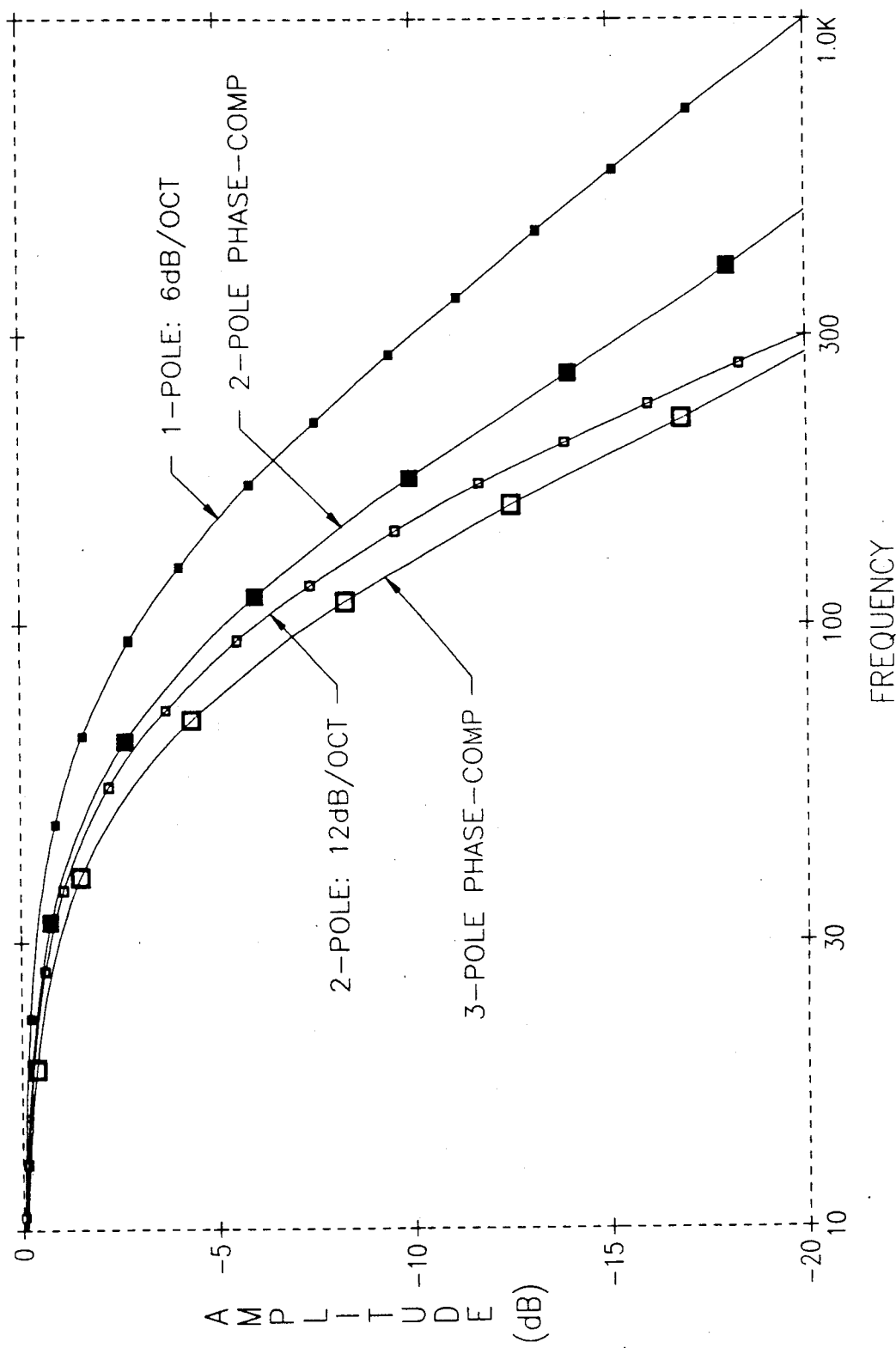
FIGS. 3a and 3b are the amplitude versus frequency and related phase shift versus frequency plots of the tone control equalizer shown in FIG. 1 (large solid squares) and, for comparison, the corresponding plots of a one-pole filter (small solid squares), two-pole filter without phase compensation (small open squares), and a three-pole filter with the phase compensation of the invention (large open squares).
Figure 3B:
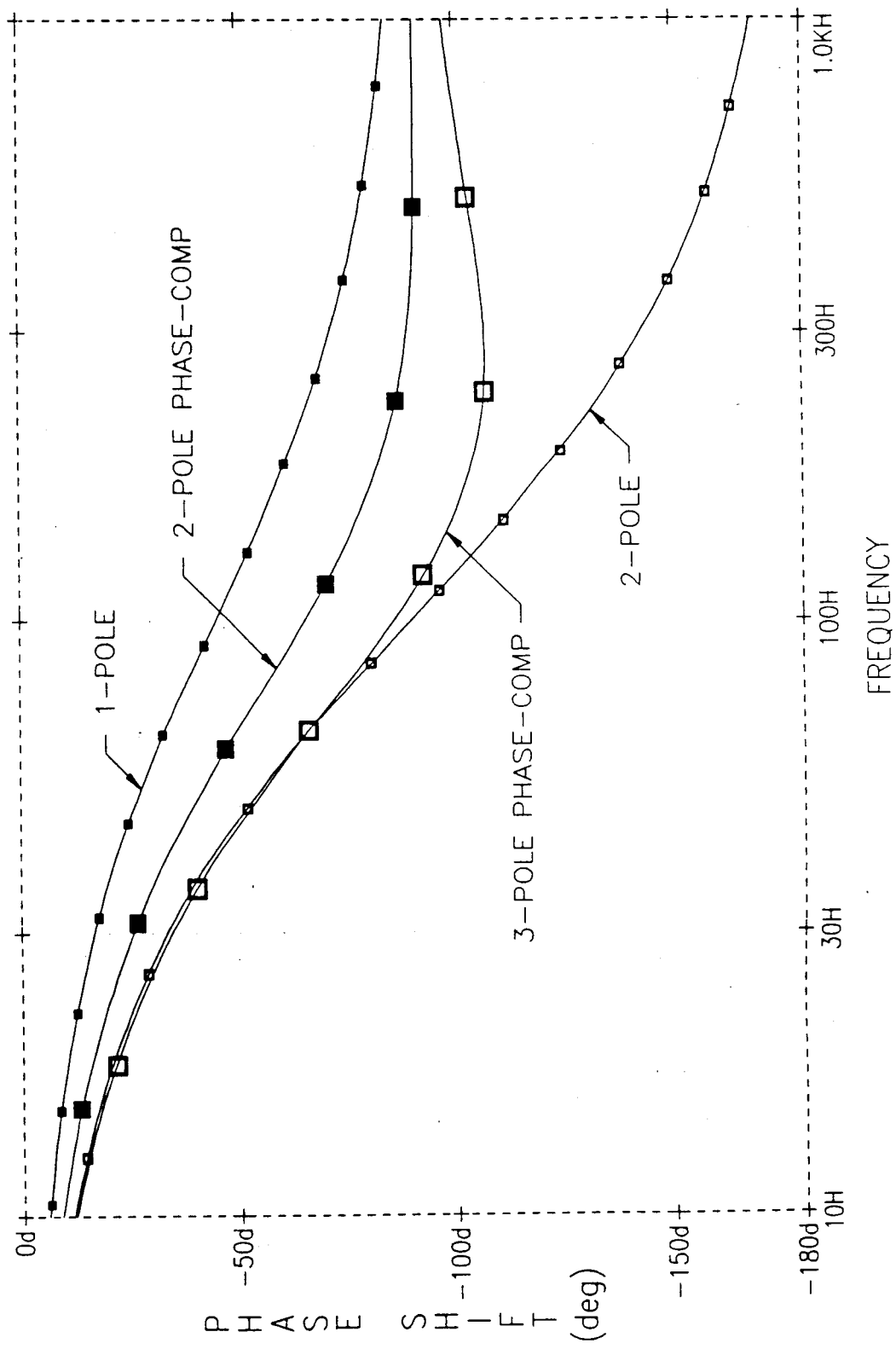

FIGS. 3a and 3b illustrate for comparison purposes the amplitude versus frequency and the phase shift versus frequency of the prior art one-pole conventional filter indicated by small, solid squares in the plot with a two-pole, phase compensated filter network (larger solid squares) as provided in the tone control equalizer of FIG. 1. Also for comparison purposes on FIGS. 3a and 3b are plots of a two-pole filter without a zero offset compensation (small open squares). A three-pole, two-zero phase compensation is also shown (larger open squares) which corresponds to an alternative embodiment of the invention shown in FIG. 5 and discussed further herein. It is observed from FIG. 3a that the two-pole phase compensation provides a relative attenuation slope that is significantly steeper than the one-pole response characteristics but is slightly less sharp relative to the two-pole uncompensated attenuation slope. The three-pole phase compensation is even sharper than the two-pole phase compensation and may be a desirable alternative, in some applications, to the currently preferred embodiment of FIG. 1.

With reference to FIG. 3b, the constraint on the phase shift is well illustrated by comparing the two-pole uncompensated phase shift characteristics of the bass filter where the signal will shift in phase through 90° at 100 Hz and continues on toward the 180° phase shift regime as the signal approaches mid-band. By comparison, the two-pole phase compensated curve (with the offset zero added) shows the phase shift increases toward the 90° shift level but never reaches 90°, leveling out to a shift of somewhat less than 90° as the frequency approaches the center of mid-band.

A similar advantage is shown for the three-pole phase compensation (two compensating zeros) provided in accordance with the invention wherein the phase shift follows the two-pole shift through about the 90° point at 100 Hz, but then is restrained to just slightly more than 90° throughout the rest of the frequency regime up to the center frequency of 1 kHz where it bends back to about 90°. Thus, the phase shift plots for one-pole, two-pole phase compensated, and three-pole phase compensated all provide stable filter circuits without significant dropouts, and yet the two-pole phase compensated and three-pole phase compensated filter circuits in accordance with the invention offer the significantly enhanced steepness of the accelerated response curve at the edges of the high and low bands.

FIG. 4a shows the bass (low frequency) and FIG. 4b, the treble (high frequency) active filter stages 18 and 20 removed from the shelving equalizer of FIG. 1. As indicated by the numerical notations of FIG. 4c, the zero for the bass two-pole, one-zero filter network 18 is placed optimally at 1.8 times the corner frequency of the pole; and the zero for the treble filter network 20 is placed at a frequency obtained by dividing the pole corner frequency by the 2.2 factor.

Figure 5:
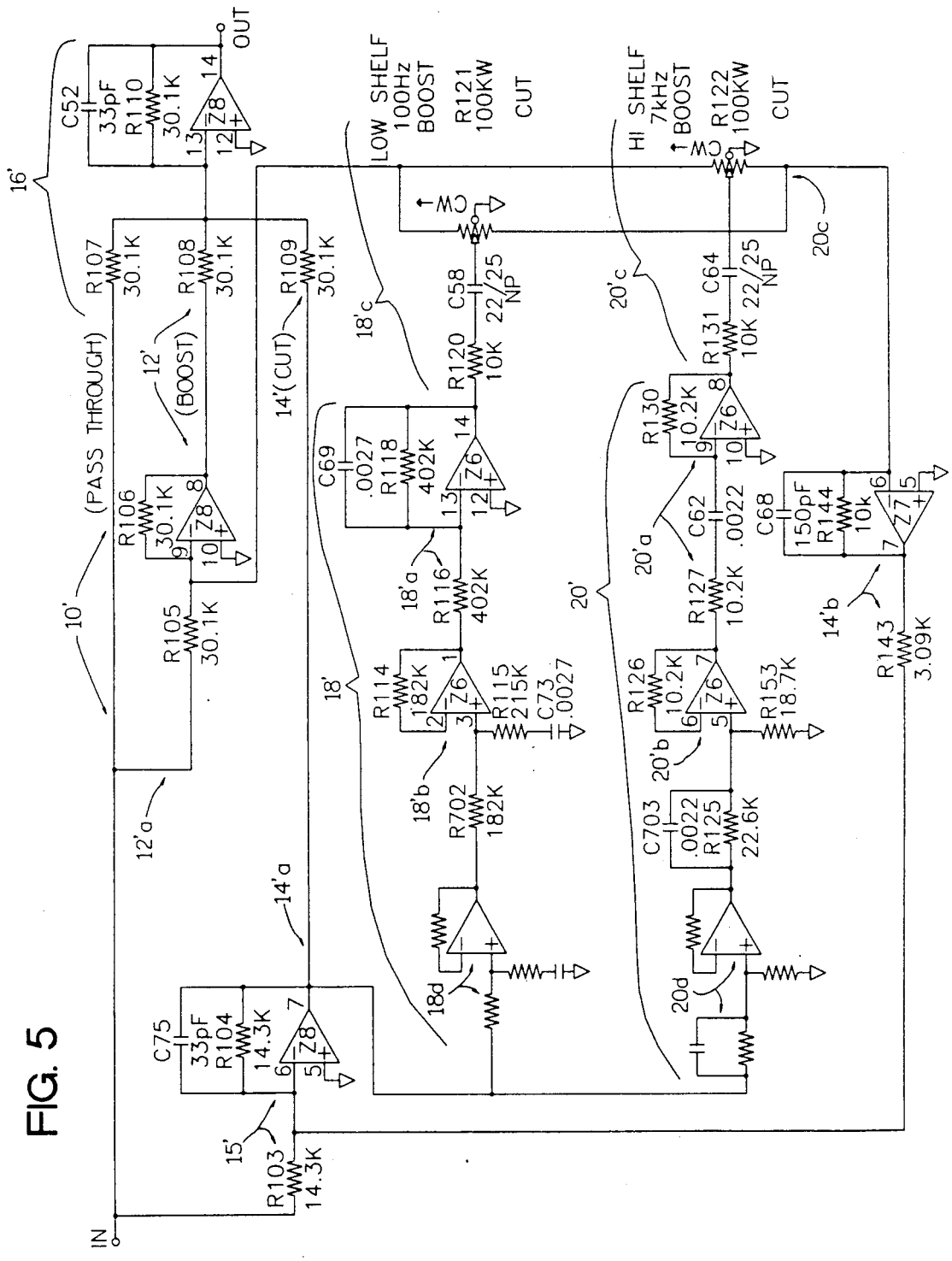
FIG. 5 a schematic diagram of an alternative embodiment having three-pole, two-zero filters in which the added offset zero phase compensates the added third pole just as the one zero compensates for the one additional pole in the two-pole, one-zero equalizer circuit of FIG. 1.

FIG. 5 is an alternative embodiment (prime notations refer to corresponding components of the FIG. 1 embodiment) of the tone control equalizer having bass and treble filter sections 18' and 20' augmented with an additional pole and compensating offset zero for even greater slope acceleration. The added pole and offset zero are provided by repeating stages 18b and 20b and are shown as 18d and 20d, respectively. It is very interesting to note that the actual slopes of the full theoretical +12 dB boosted response, using the three-pole circuit, is only about 5.2 dB/oct. So, three-poles wants to be 18 dB/oct. but only yields about 5 dB/oct. Very roughly each pole improves the slope by about 1 db/oct.; however, the sonic benefit is immense since the total area under the curve now unaffected is large.

Figure 6A:
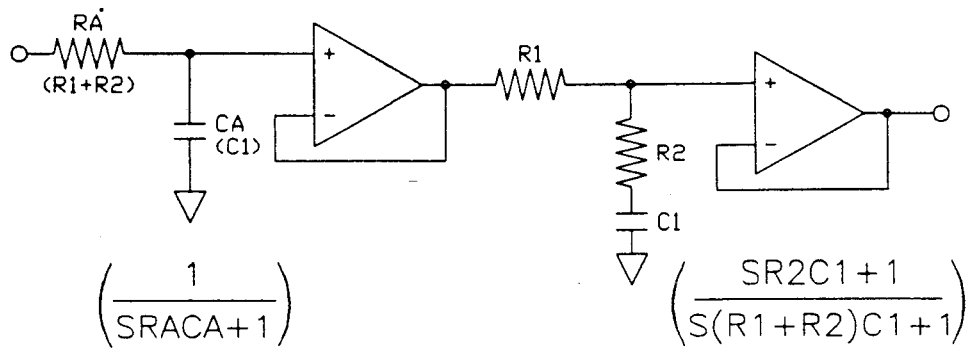
FIGS. 6a, 6b and 6c are a set of related figures showing respectively a non-inverting phase compensated filter stage for bass (low end) frequencies and associated frequency/component value computations for the poles and zero locations, a simplified amplitude versus frequency plot showing the location of the corner frequencies of the poles and zero related to the circuit components of the filter stage of FIG. 6a, and a treble (high end) filter stage of the non-inverting type that is the complement of the bass filter and also showing the frequency/component value computations.
Figure 6B:
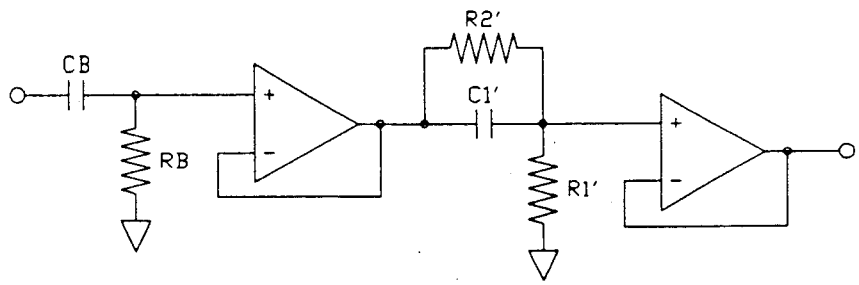
Figure 6C:
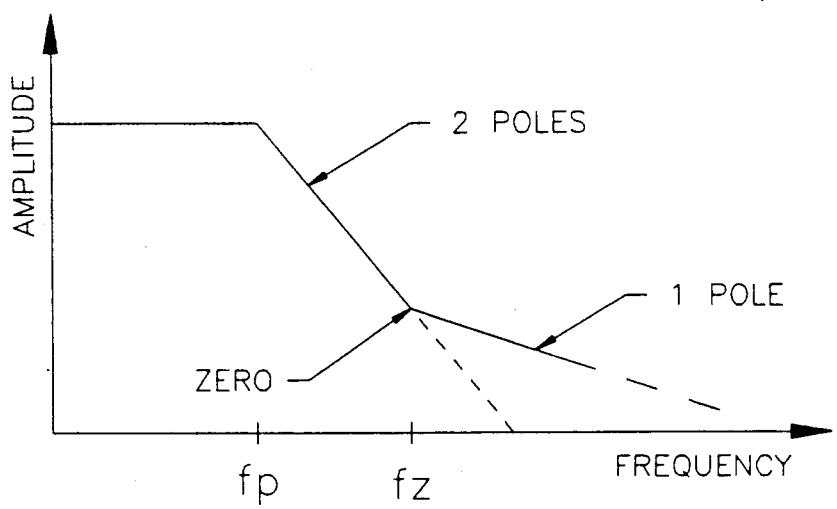

It is noted in regard to the filter circuits shown in FIG. 1 and 4a,b and discussed above, these are inverting equalization networks. For alternative non-inverting equalizer networks such as might be used in a configuration, for example, as taught by Gundry U.S. Pat. No. 3,921,109, different active filter networks would be used, but the theory and principles of the present invention are the same. FIGS. 6a, 6b and 6c show the filter configurations and associated RC value computations for two-pole, one-offset zero non-inverting active stages suitable for use in alternative shelving equalizers in accordance with the principles of the invention.

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. A bass and treble audio tone control circuit for changing amplitude versus frequency response in low and high bands respectively on opposite ends of a mid-band, comprising:

bass boost/cut shelving filter means and filter output setting control means therefor;

treble boost/cut shelving filter means and filter output setting control means therefor;

at least one of said filter means having n poles and n−1 compensation zeros, wherein n is any integer of 2 or more, said n poles positioned to cause a substantially n pole amplitude versus frequency response in a transition band adjacent one end of said mid-band, and said n−1 zeros being offset toward said mid-band from said n poles so as to cause substantial cancellation of n−1 poles in said mid-band, whereby the amplitude versus frequency response in said mid-band is substantially unaffected by changes in settings of said output setting control means.

2. The bass and treble audio tone control circuit of claim 1 wherein both said bass boost/cut shelving filter means and said treble boost/cut shelving filter means have said n poles and n−1 compensation zeros.

3. The bass and treble audio tone control circuit of claim 1, wherein n=2.

4. The bass and treble audio tone control circuit of claim 1, wherein n=3.

5. An active equalizer circuit for controllably altering the amplitude versus frequency response characteristics of an audio signal having a frequency range that includes a mid-band and an adjacent band, high or low thereto, that is to be controllably altered in relative amplitude, comprising:

a filter means for said adjacent band, and means for controllably setting signal output for said filter means, said filter means having at least first and second poles and at least one compensation zero, said first and second poles and said at least one compensation zero selected in value so as to cause a multiple-pole frequency dependent amplitude change in said adjacent band and wherein said at least one compensation zero is at an offset from said poles so as to cause cancellation of one of said poles for frequencies approaching and within said mid-band, whereby the multiple poles provide a sharper amplitude versus frequency change in said adjacent band without causing excessive phase shift of the audio signal at the frequencies occupying said mid-band.

6. The active equalizer circuit of claim 5, wherein there are both high and low adjacent bands, and each has a filter means having said at least first and second poles and said at least one compensation zero at said offset.

7. The active equalizer circuit of claim 5, wherein said filter means comprises a high-band filter stage for altering amplitude versus frequency characteristics of a high-band adjacent said mid-band and a low-band filter stage for altering amplitude versus frequency characteristics of a low-band adjacent said mid-band, and wherein each of said high and low band filter stages comprise said at least first and second poles and said at least one compensation zero at said offset so that change in settings of the means for controllably setting signal output of said filter stages does not substantially influence the amplitude of mid-band frequencies.

8. The active equalizer circuit of claim 5, comprising shelving equalizer circuit means, and said filter means being incorporated in said shelving equalizer circuit means and including an inverting amplifier filter stage.

9. The active equalizer circuit of claim 7, wherein each of said high and low band filter stages comprise separate controllable output setting means for signals that pass through each of said high and low band filter stages, whereby variable settings of output do not substantially change the signal level at mid-band.

10. The active equalizer circuit of claim 5, wherein said filter means comprises a third pole and a second compensation zero, said third pole being located substantially at the frequency of said first and second poles to cause an amplitude versus frequency response that tends to a three-pole frequency dependent response, and said second compensation zero is located substantially at the frequency of said at least one compensation zero so as to cancel two of said poles for those frequencies in the transition between said adjacent band and said mid-band.

11. The active equalizer circuit of claim 5, comprising shelving circuit means incorporating said filter means and including a non-inverting amplifier filter stage.

12. The active equalizer circuit of claim 5, wherein said at least one compensation zero is located at a frequency so as to cause cancellation of one of said poles that is at or near the edge of said mid-band so that the phase shift of the audio signal at said edge of said mid-band is limited substantially to the phase shift associated with a single pole.

13. The active equalizer circuit of claim 12, wherein said at least one compensation zero of said filter means is located at a frequency so that the phase shift of the audio signal at said edge of said mid-band approaches but does not significantly exceed 90°.

14. The active equalizer circuit of claim 5, wherein said filter means has a first filter stage including an operational amplifier and an associated RC network providing said first pole, and a second filter stage having an operational amplifier and RC network providing said second pole and said at least one said compensation zero, said first and second filter stages being in cascade.

15. The active equalizer circuit of claim 5, said filter means comprising shelving filter circuit for causing the amplitude versus frequency response characteristics of the audio signal to exhibit the shape of a shelf in said adjacent band at non-zero settings of signal output.

16. The active equalizer circuit of claim 12, wherein said filter means is for an adjacent band having frequencies lower than said mid-band, and said at least one compensation zero of said filter means is located at a frequency that is substantially 1.75 to 2.75 times the frequency of said first and second poles.

17. The active equalizer circuit of claim 12, wherein said filter means is for an adjacent band having frequencies lower than said mid-band, and said at least one compensation zero of said filter means is located at a frequency that is substantially 1.8 times the frequency of said first and second poles.

18. The active equalizer circuit of claim 12, wherein said filter means is for an adjacent band having frequencies higher than said mid-band, and said at least one compensation zero of said filter means is located at a frequency that is substantially 1.75 to 2.75 divided into the frequency of said first and second poles.

19. The active equalizer circuit of claim 12, wherein said filter means is for an adjacent band having frequencies higher than said mid-band, and said at least one compensation zero of said filter means is located at a frequency that is substantially 2.2 divided into the frequency of said first and second poles.

* * * * *